United States Patent [19]

Rapisarda

[11] Patent Number: 5,504,034
[45] Date of Patent: Apr. 2, 1996

[54] LOCAL OXIDATION METHOD WITH BIRD'S BEAK SUPPRESSION

[75] Inventor: Cirino Rapisarda, Belpasso, Italy

[73] Assignee: Consorzio per la Ricerca sulla Microelettronica nel Mezzogiorno, Catania Ct, Italy

[21] Appl. No.: 124,695

[22] Filed: Sep. 20, 1993

[30] Foreign Application Priority Data

Sep. 23, 1992 [EP] European Pat. Off. .............. 92830514

[51] Int. Cl.$^6$ .................................................. H01L 21/76
[52] U.S. Cl. .................................................. 437/72
[58] Field of Search .............. 437/69, 72; 148/DIG. 85, 148/DIG. 86

[56] References Cited

U.S. PATENT DOCUMENTS

| | | | |
|---|---|---|---|
| 4,563,227 | 1/1986 | Sakai et al. | 437/69 |
| 5,254,494 | 10/1993 | Van der Plas et al. | 437/72 |

FOREIGN PATENT DOCUMENTS

| | | |
|---|---|---|
| 0052948 | 6/1982 | European Pat. Off. . |
| 59-94844 | 5/1984 | Japan . |
| 60-21541 | 2/1985 | Japan . |
| 61-296741 | 12/1986 | Japan . |
| 62-13047 | 1/1987 | Japan . |
| 62-133732 | 6/1987 | Japan . |
| 64-53559 | 3/1989 | Japan . |
| 8601415 | 1/1988 | Netherlands . |

OTHER PUBLICATIONS

IBM Technical Disclosures Bulletin, vol. 24, No. 9 Feb. '82 New York, USA pp. 4744–4745.

Chiu et al., "The SWAMI—A Defect Free and Near–Zero Bird's–Beak Local Oxidation Process and Its Application in VLSI Technology," 1982 IEDM 224ff.

"A new fully recessed–oxide field isolation technology for scaled VLSI Circuit fabrication," IEEE Electron Device Letters, vol. EDL–7, No. 2, Feb. 1986, pp. 124–126.

*Primary Examiner*—George Fourson
*Attorney, Agent, or Firm*—Robert Groover; Betty Formby

[57] ABSTRACT

A method for eliminating the bird's beak from selective oxidations of semiconductor electronic devices having a semiconductor substrate (1) which is covered by a pad oxide layer (2) covered, in turn, by a first layer (3) of nitride, and wherein at least one vertical-walled pit (11) is defined for growing an isolation region, comprises the sequential steps of: selectively etching the oxide layer (2) within the pit (11) to define peripheral recesses (6,8) between the substrate (1) and the nitride; filling the recesses (6,8) with nitride; and growing oxide in the pit (11) so as to form the isolation region contrasting the nitride portions (9,10) which occlude the recesses (6,8).

36 Claims, 6 Drawing Sheets

LOCAL OXIDATION METHOD WITH BIRD'S BEAK SUPPRESSION

CROSS-REFERENCE TO RELATED APPLICATION

This application claims priority from EPC App'n 92830514.3, filed Sep. 23, 1992, which is hereby incorporated by reference.

BACKGROUND AND SUMMARY OF THE INVENTION

This invention relates to methods for integrated circuit isolation, and more particularly to methods for eliminating the bird's beak effect from selective local oxidations of semiconductor electronic devices.

Adjacent elements on an integrated circuit must be electrically isolated from each other if they are to function independently. Therefore, it has long been recognized that the most basic elements of integrated circuit technology include not only active devices and interconnect, but also isolation.

The standard industry process for isolation of CMOS circuits has long been LOCOS ("LOcal Oxidation of Silicon"). In this process, a layer of silicon nitride[1] is patterned to provide an oxidation barrier in locations where active devices are to be formed (i.e. the active regions). The wafer is then placed in an oxidizing environment to grow a thick field oxide (typically at least several thousand Angstroms)[2] on the exposed silicon areas. Silicon under the nitride will generally not be oxidized EXCEPT at the edge of the nitride, where lateral diffusion of oxygen under the nitride will cause a laterally tapered shape, known as a "bird's beak," in the resulting structure.

[1] Typically this nitride is not directly deposited on silicon, but overlies a thin oxide layer. This nitride/oxide layer (which may include additional layers) is often referred to as the "active stack."
[2] The thickness of the field oxide must be sufficient that a conductors atop the field oxide cannot invert the silicon under the oxide (with "channel-stop" or other doping therein), to turn on parasitic transistors.

A typical sequence of the operations involved in a LOCOS technique is shown in FIGS. 1, 2 and 3 of the accompanying drawings. An oxide layer 2 is grown over a substrate 1 of semiconductor silicon. The oxide 2 is then covered with a nitride layer 3, and a subsequent phototechnique step is used to pattern this active stack (oxide 2 and nitride 3), so that the desired isolation locations are exposed, and the desired active areas are covered. A thick layer of silicon oxide is grown to the configuration shown in FIG. 2. During this growth process, oxygen diffuses through the accumulating silicon dioxide layer to the growth interface. Subsequent removal of the nitride yields the structure shown in FIG. 3.

Standard LOCOS technology invariably leaves a bird's beak (the laterally tapered portion) whose length is typically about 85% of the grown oxide thickness. This results in a loss of active area available for making the device. Thus, the design effort devoted to reducing the size of the device, that is the occupied semiconductor area, is frustrated by the area penalty of the bird's beak.

To obviate this serious drawback, the prior art has suggested a number of expedients directed to reducing the size of the bird's beak.

It is well recognized, for instance, that a reduction in length of the beak would also depend on the capability of the nitride to seal the silicon surface and prevent oxygen from diffusing across the nitride/silicon oxide interface. See, e.g., "Sealed-interface local oxidation technology", IEEE TRANS. ELECTRON DEVICES, vol. ED-29, pages 644–561, April 1982; Hui et al., "Electrical Properties of MOS Devices Made With SILO Technology," 1982 IEDM 220ff; both of which are hereby incorporated by reference.

In order to reduce the size of the beak, one might think of subjecting the silicon surface to a direct nitriding process, but such an approach would not be practicable-because it introduces defects from thermal stress.

A second prior art alternative is known by the acronym SWAMI (Sidewall Masked Isolation Technology). See Chiu et al., "The SWAMI—A Defect Free and Near-Zero Bird's-Beak Local Oxidation Process and Its Application in VLSI Technology," 1982 IEDM 224ff, which is hereby incorporated by reference. While being advantageous from several aspects, that technique is beset with problems of sidewall profile control and etching depth. In addition, damage may be caused to the silicon surface during the silicon island etching.

To overcome such problems, the FUROX (FUlly Recessed OXide) method has been proposed as described in "A new fully recessed-oxide field isolation technology for scaled VLSI Circuit fabrication", IEEE ELECTRON DEVICE LETTERS, vol. EDL-7, No. 2, February 1986, pages 124–126, which is hereby incorporated by reference. This process involves at least two separate oxidation steps, of which the first still results in the development of a bird's beak of significant size.

Various other approaches have been proposed, including numerous variations of the aforesaid methods, but all of these still fall short of solving the problems. For example, Jambotkar, "Method for forming recessed Oxide Isolation Islands," 24 IBM TECHNICAL DISCLOSURE BULLETIN 4744–4745(February 1982), which is hereby incorporated by reference, suggests undercutting and backfilling the pad oxide layer in the active stack, and then etching silicon (apparently using an isotropic etch), to achieve a recessed oxide. However, this process does not achieve the objectives of improved density provided by the inventions disclosed herein.

The technical problem addressed by the present invention is to provide a method for eliminating the so-called bird's beak from local oxidations, while overcoming the limitations of current approaches based on prior art techniques.

The solutive idea on which this invention stands is one of only providing a pure nitride/silicon interface in the area where the oxide is to be grown. This avoids the introduction of any defects due to deposition stress into the active areas of the semiconductor device. To achieve this, the pad oxide layer of the "active" stack is undercut and backfilled with nitride, and a recess is then anisotropically etched into the silicon, before the growth of the field oxide.

This has the advantage of providing reduced lateral encroachment on the active area, while also providing improved planarization of the active and isolation regions.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

Figure 1:
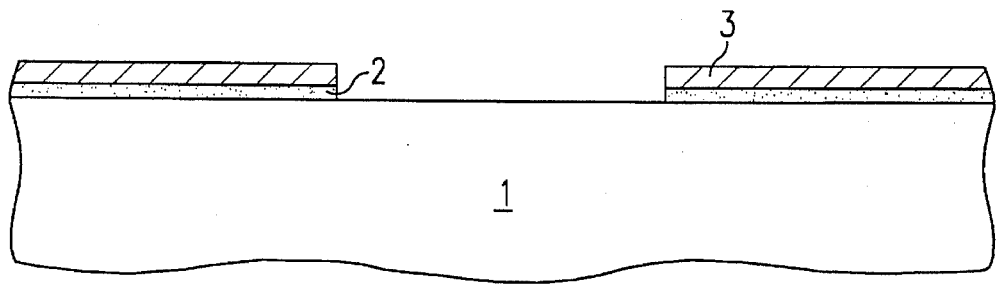
FIGS. 1 to 3 are respective views showing schematically the production of a local oxidation on a semiconductor device.
Figure 2:
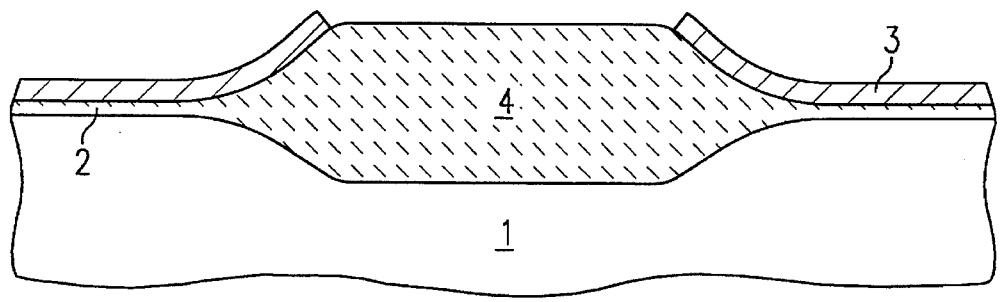
Figure 3:
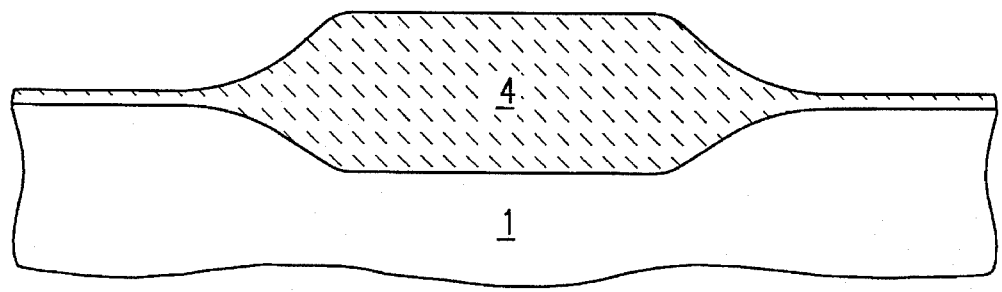
Figure 4:
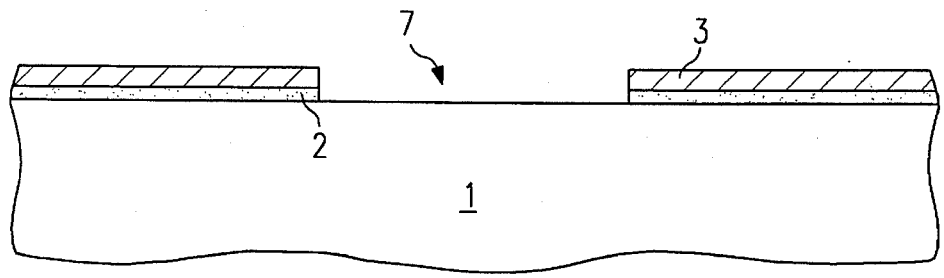
FIGS. 4 to 9 are enlarged scale, vertical section views showing schematically a monolithic semiconductor device having a planar structure, to which the method of this invention has been applied.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

With reference to the drawing views, the steps of the method according to the invention are illustrated therein in schematic form through successive modifications to the morphology of a monolithic semiconductor device.

The device comprises a monocrystalline silicon substrate 1 over which a layer 2 of silicon thermal oxide has been grown, e.g. to a thickness of 200 Å. The oxide 2 is covered by a first layer 3 of silicon nitride.

Using conventional techniques, a recess 7 is opened through the layers 2 and 3 to the substrate 1. This recess 7 is intended to provide an isolation region, such as a field oxide region.

Figure 5:
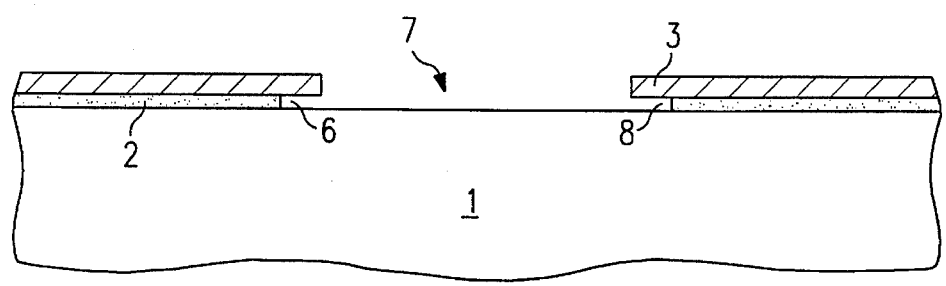
Figure 6:
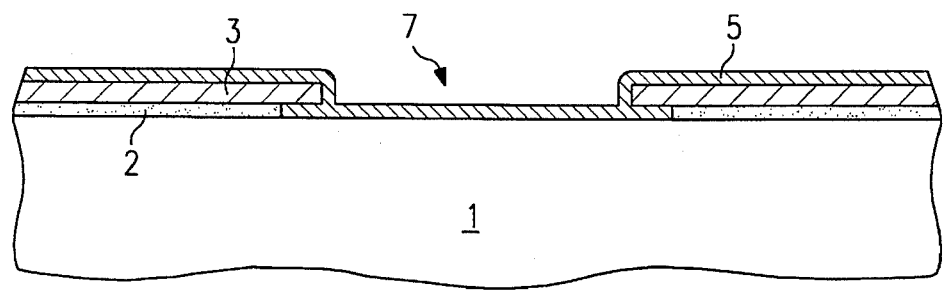

The method of this invention provides for selective wet etching, using diluted hydrofluoric acid, with removal of the thermal oxide 2 from around the sides of the recess 7, between the substrate 1 and the nitride 3, as shown in FIG. 5. The etching only affects that area of the recess which is unprotected by the nitride and defines opposing recesses 6 and 8 at the sides of the recess 7. The etching depth will depend on its duration. In a sample embodiment, this is performed using a 1:20 solution of HF in water for 25 minutes, to produce a recess depth of 2500 Å.

At this point, a second layer 5 of nitride is deposited, e.g. to a thickness of 120 Å. The thickness of this, the second, layer 5 is slightly greater than one half the thickness of the thermal oxide 2. The deposition of nitride also extends to the interior of the recess 7.

This process step is directed to fill the recesses 6 and 8, dug in the oxide 2 at the sides of the recess 7 in the previous wet etching step, with nitride.

Each recess, 6 or 8, may be regarded as a small trench which requires planarization, following deposition of the second layer 5 of nitride.

The second layer 5 of nitride is then removed by an isotropic etch (e.g. by etching with concentrated orthophosphoric acid for 3 minutes at 150° C.), except from the recesses 6 and 8 underlying the first layer 3 of nitride. These recesses will be obstructed, therefore, by the nitride 5.

Figure 7:
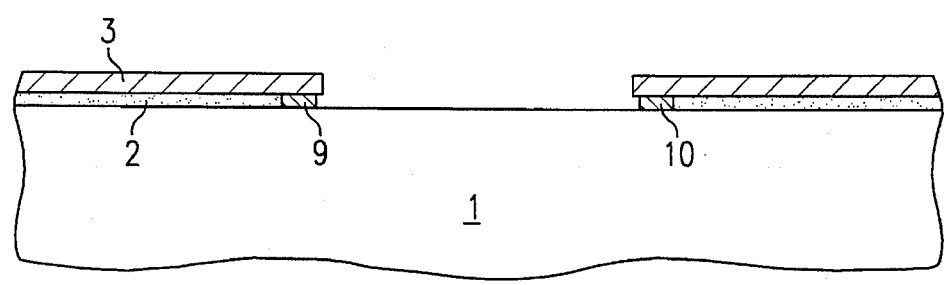
Figure 8:
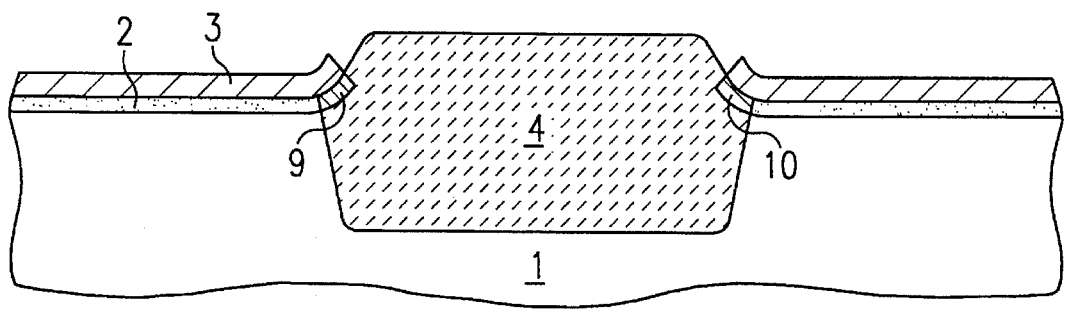

The net outcome of this operation is illustrated schematically by FIG. 7, where 9 and 10 designate the nitride portions that have gone to fill, and substantially occlude, the recesses 6 and 8.

Figure 9:
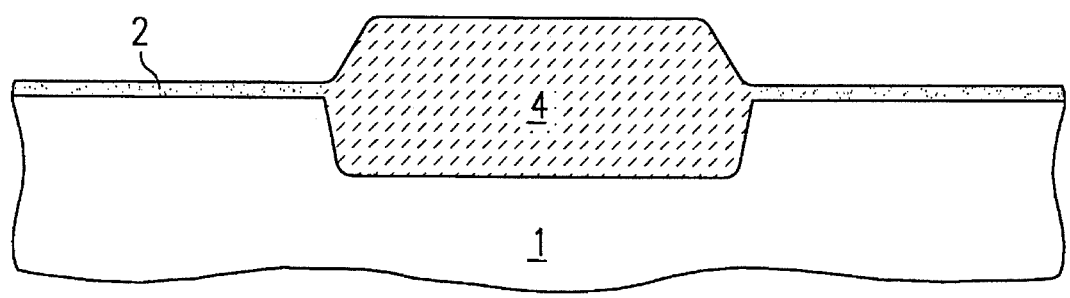

At this point, field oxide 4 could be grown in the recess 7. Advantageously, the presence of the occlusions 9 and 10 of nitride will oppose formation of the bird's beak while the field oxide is grown. This is due to that the pure nitride/silicon interface, created at the recesses 6 and 8, prevents migration of the oxygen, and hence formation of the bird's beak, as has been confirmed by experimental observation. Final removal of the nitride layers 5 (and, therefore, of portions 9–10) and 3 would then enable the peculiar beakless profile of the field oxide 4 yielded by the inventive method to be appreciated from FIG. 9.

However, in the presently preferred embodiments a silicon etch step is also used, to obtain the advantage of better planarization of the field oxide. An example of this method is shown in FIGS. 10–14. In this embodiment, details of the semiconductor device having the same construction or function as in the previously described embodiment are denoted by the same reference numerals.

Figure 10:
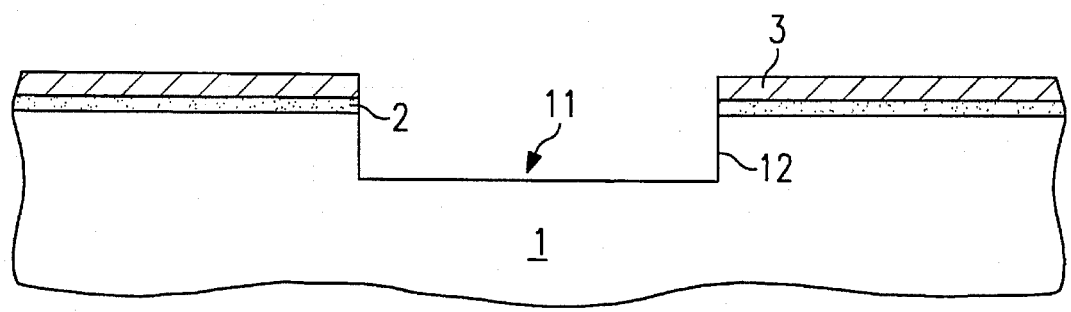
FIGS. 10 to 14 show schematically a second exemplary application of the inventive method, specifically to non-planar structures.

Shown in FIG. 10 is a semiconductor device which comprises the substrate 1, layer 2 of thermal oxide and first upper layer 3 of nitride. The device has been formed with a pit 11 which is deeper than the recess 7 previously described. In fact, this pit 11 is also dug in the substrate 1 to define a location 12 for receiving an isolation region 4 consisting of field oxide. Of course, channel stop implants as needed can be performed once the pit 11 is exposed.

Figure 11:
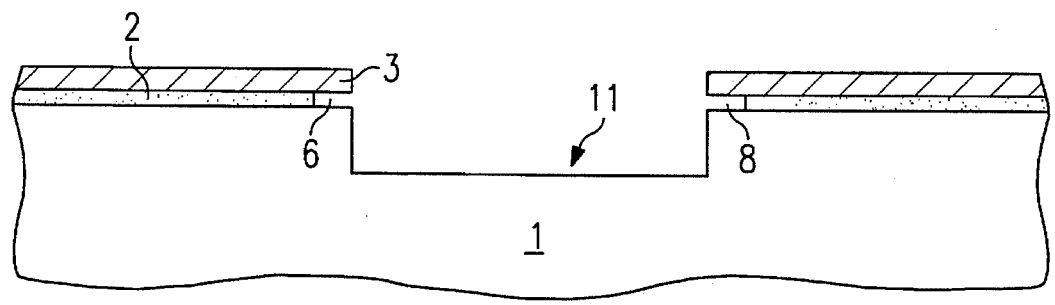
Figure 12:
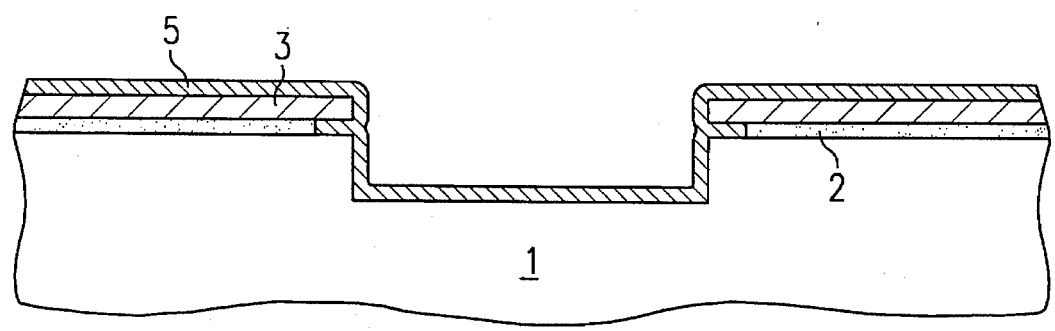
Figure 13:
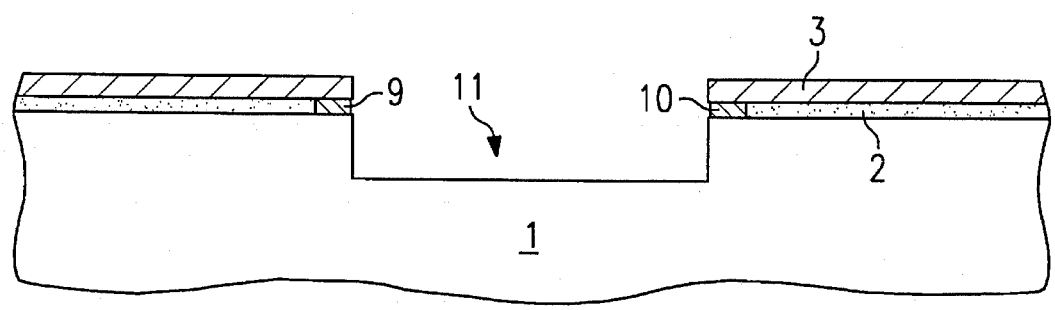

The inventive method provides, in this embodiment, for selective wet etching, using diluted hydrofluoric acid. This etching only causes the thermal oxide 2 to be dug laterally of the pit 11, as shown in FIG. 11.

The etching is only effective in the pit area unprotected by the nitride 3 and defines opposing recesses 6 and 8 at the sides of the pit 11. The digging depth will depend on the etching duration.

The next step consists of depositing a second layer 5 of silicon nitride. This second layer of nitride has a thickness slightly greater than one half that of the thermal oxide layer 2.

The nitride of the layer 5 also penetrates the recesses 6 and 8, obstructing them.

A subsequent etching step enables the nitride layer 5 to be removed, except from the recesses 6 and 8 which will remain occluded by residues 9 and 10.

At this point, the field oxide 4 is grown in the seat 12.

As mentioned before, the presence of nitride occlusions is effective to resist formation of the bird's beak while the field oxide 4 is grown.

Figure 14:
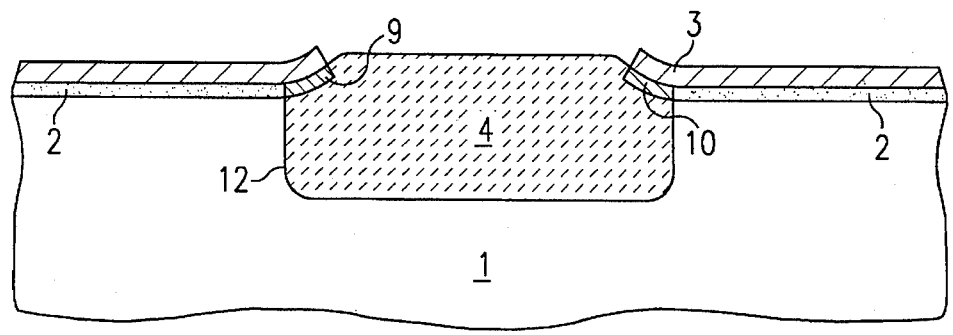
Figure 15:
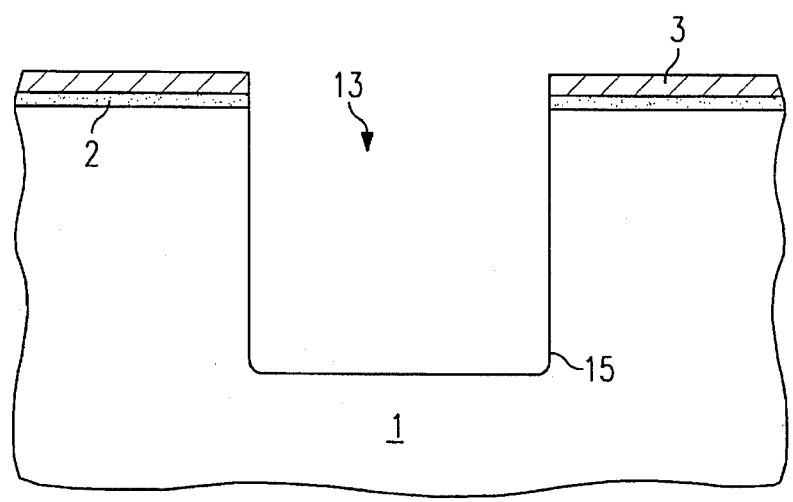
FIGS. 15 to 19 show schematically a third embodiment of the method according to the invention.

It has been observed experimentally, in fact, that the profile of the field oxide 4 grown in the seat 12 is free of the intrusive bird's beak, as can be appreciated from FIG. 14.

A further class of inventive embodiments is shown in FIGS. 15–19. This example relates specifically to a possible embodiment Of the inventive method directed to allow the formation of sidewall oxide in a trench-type structure.

For this purpose, a semiconductor substrate 1 is provided as in the previous embodiments which is covered by a layer 2 of thermal oxide, in turn covered by a first layer 3 of nitride.

The semiconductor is formed with a deep pit 13, or so-called trench (FIG. 15), defining a seat 15 wherein the so-called sidewall oxide is received.

Figure 16:
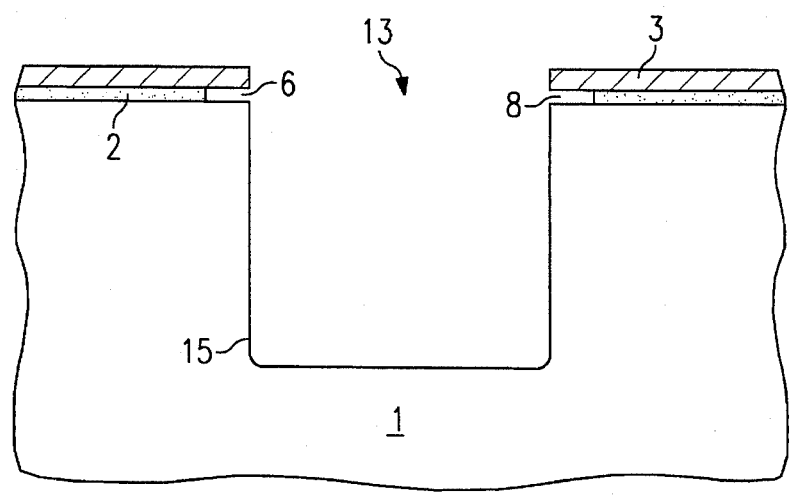
Figure 17:
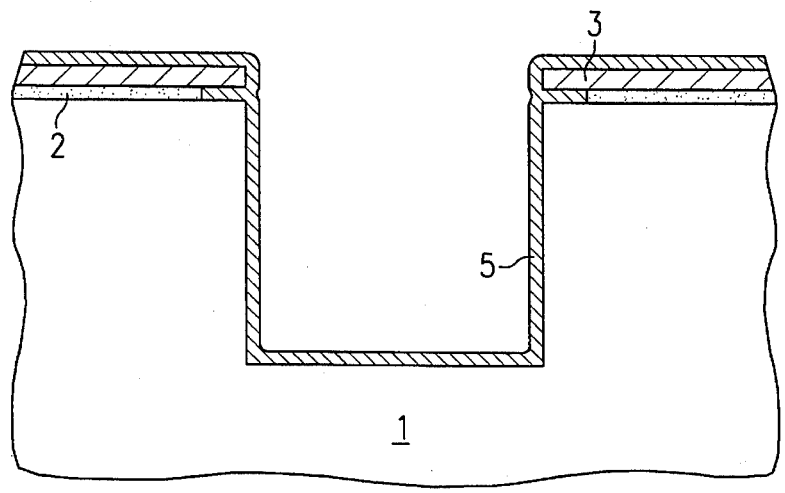
Figure 18:
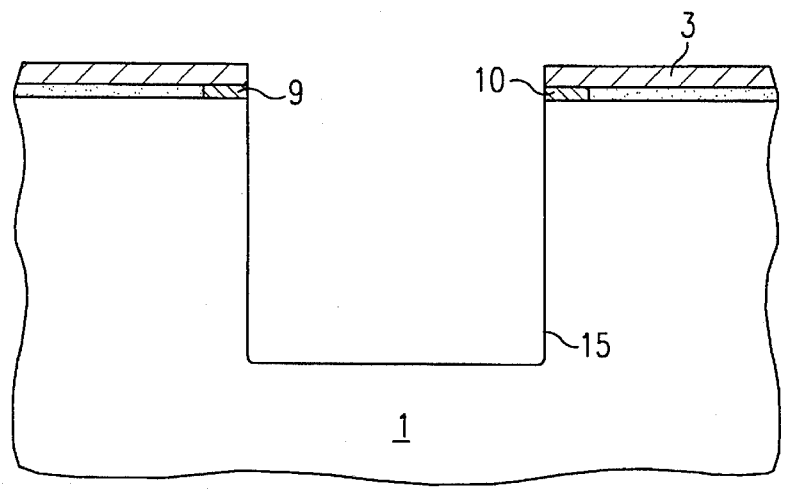

A first selective wet etching step, using diluted hydrofluoric acid, results in just the thermal oxide 2 being dug laterally of the trench s shown in FIG. 16.

The etching is only effective in the uncovered area, unprotected by the nitride 3, and defines oppositely located recesses 6 and 8 at the sides of the trench 13. The digging depth will depend on the duration of the etching applied.

The next step in the method consists of depositing a second layer 5 of silicon nitride. This, the second, layer of nitride slightly exceeds in thickness one half of the thermal oxide layer 2 thickness.

The layer 5 nitride is deposited isotropically across the sidewalls of the trench 13 and also penetrates the recesses 6 and 8, obstructing them.

Similarly as in the previous embodiments, a subsequent etching step enables the nitride layer 5 to be removed, excepting from the recesses 6 and 8 which remain occluded by residues 9 and 10.

At this point, the sidewall oxide 14 is grown on the inner walls of the seat 15.

Figure 19:
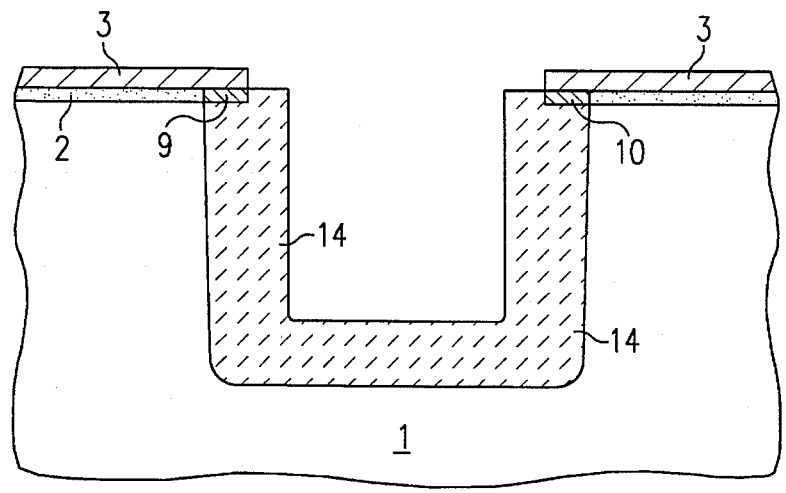

It can be appreciated from the example shown in FIG. 19 that the resultant profile of the sidewall oxide 14 from the inventive method exhibits no bird's beak.

Understandably, the semiconductor structure may be completed with the addition of active areas within the region bounded by the sidewall oxide.

The major advantages afforded by the method of this invention include the possibility of enhancing the degree of integration of semiconductor electronic devices.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Of course, the innovative device isolation steps can be used in combination with numerous other known steps. The process steps provided by the present invention would typically be preceded by well formation (and, if desired, epitaxial growth, formation of buried layers, etc.), and would be followed by formation of active devices, contacts, interconnects, and passivation, according to the numerous options known in the art.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A fabrication method, comprising the steps of:
   (a.) providing a substrate which includes at least one substantially monolithic body of silicon;
   (b.) forming a pad layer of silicon dioxide over the surface of said body;
   (c.) forming an oxidation-resistant layer of silicon nitride over said pad layer;
   (d.) patterning and etching said oxidation-resistant layer and said pad layer to expose said body in locations where isolation is desired, and anisotropically etching a recess in said body;
   (e.) selectively isotropically etching said pad layer, but not said oxidation-resistant layer, to form undercuts beneath said oxidation-resistant layer;
   (f.) conformally depositing and isotropically etching an additional layer of silicon nitride, to occlude said undercuts;
   (g.) oxidizing the resulting structure, to form a field oxide; and
   (h.) removing said pad and oxidation-resistant layers, to expose locations where active devices can be formed.

2. The method of claim 1, wherein said body consists of silicon.

3. The method of claim 1, wherein said pad layer has a thickness of about 200 Å.

4. The method of claim 1, wherein said pad layer has a thickness in the range of about 100 Å–400 Å.

5. The method of claim 1 wherein said conformal deposition in said step (f) is performed to more than half the thickness of said pad layer.

6. The method of claim 1, wherein said isotropic etching in said step (f) is performed by wet etching.

7. The method of claim 1, wherein said isotropic etching step (e) is a wet etching step.

8. The method of claim 1, wherein said oxidizing step (g) totally fills said recess etched in said step (d).

9. The method of claim 1, wherein said step (d) etches said recess to a depth which is greater than 1000 Å.

10. A fabrication method, comprising the steps of:
   (a.) providing a substrate which includes at least one substantially monolithic body of semiconductor material comprising silicon;
   (b.) forming a pad layer over the surface of said body;
   (c.) forming a layer of an oxidation-resistant material over said pad layer;
   (d.) patterning and etching said oxidation-resistant layer and said pad layer to expose said body in locations where isolation is desired, and anisotropically etching a recess in said body;
   (e.) selectively isotropically etching said pad layer, but not said oxidation-resistant layer, to form undercuts beneath said oxidation-resistant layer;
   (f.) conformally depositing and isotropically etching an additional layer of oxidation-resistant material, to occlude said undercuts;
   (g.) oxidizing the resulting structure, to form a field oxide; and
   (h.) removing said pad and oxidation-resistant layers, to expose locations where active devices can be formed.

11. The method of claim 10, wherein said body consists of silicon.

12. The method of claim 10, wherein said pad layer has a thickness of about 200 Å.

13. The method of claim 10, wherein said pad layer consists of silicon dioxide.

14. The method of claim 10, wherein said pad layer has a thickness in the range of about 100 Å–400 Å.

15. The method of claim 10, wherein said conformal deposition in said (f) is performed to more than half the thickness of said pad layer.

16. The method of claim 10, wherein said isotropic etching in said step (f) is performed by wet etching.

17. The method of claim 10, wherein said isotropic etching step (e) is a wet etching step.

18. The method of claim 10, wherein said oxidizing step (g) totally fills said recess etched in said step (d).

19. The method of claim 10, wherein said oxidizing step (g) does not totally fill said recess etched in said step (d).

20. The method of claim 10, wherein said step (d) etches said recess to a depth which is greater than 1000 Å.

21. A fabrication method, comprising the steps of:
   (a.) providing a substrate which includes at least one substantially monolithic body of semiconductor material comprising silicon;

(b.) forming a pad layer over the surface of said body;

(c.) forming a layer of an oxidation-resistant material over said pad layer;

(d.) patterning and etching said oxidation-resistant layer and said pad layer to expose said body in isolation locations, and anisotropically etching a recess in said body;

(e.) selectively isotropically etching said pad layer, but not said oxidation-resistant layer, to form undercuts beneath said oxidation-resistant layer;

(f.) conformally depositing and isotropically etching an additional layer of oxidation-resistant material, to occlude said undercuts;

(g.) oxidizing the resulting structure, to form a field oxide; and (h.) removing said pad and oxidation-resistant layers, to expose active locations where active devices can be formed;

wherein said anisotropic etching in said step (d), and said oxidizing step (g), are performed with durations such that, after said step (h), the upper surface of said field oxide in said isolation locations is approximately co-planar with the upper surface of said body in said active locations.

22. The method of claim 21, wherein said body consists of silicon.

23. The method of claim 21, wherein said pad layer has a thickness of about 200 Å.

24. The method of claim 21, wherein said pad layer has a thickness in the range of about 100 Å–400 Å.

25. The method of claim 21, wherein said conformal deposition in said step (f) is performed to more than half the thickness of said pad layer.

26. The method of claim 21, wherein said isotropic etching in said step (f) is performed by wet etching.

27. The method of claim 21, wherein said isotropic etching step (e) is a wet etching step.

28. The method of claim 21, wherein said oxidizing step (g) totally fills said recess etched in said step (d).

29. The method of claim 21, wherein said oxidizing step (g) does not totally fill said recess etched in said step (d).

30. The method of claim 21, wherein said step (d) etches said recess to a depth which is greater than 1000 Å.

31. A method for eliminating the bird's beak from selective oxidations of semiconductor electronic devices having a semiconductor substrate which is covered by an oxide layer covered, in turn, by a first layer of nitride, and wherein at least one opening is defined for growing an isolation region, comprising the steps of:

selectively anisotropically etching the substrate where exposed by said opening to define a pit therein;

selectively laterally etching the oxide layer adjacent to said pit to define peripheral recesses between the substrate and the nitride;

occluding said recesses by conformal deposition and isotropic etching of a second nitride layer; and growing oxide in said pit so as to form said isolation region with reduced lateral oxide growth due to the nitride portions which occlude said recesses.

32. A method according to claim 31, wherein occlusion of the recesses is obtained by depositing a second surface layer of nitride which extends into the interior of the pit.

33. A method according to claim 32, wherein said second layer of nitride is removed before growing the oxide, except the nitride portions occluding said recesses.

34. A method according to claim 31, wherein the thickness of the second nitride layer is greater than that of the oxide layer.

35. A method for eliminating the bird's beak from selective oxidations of semiconductor electronic devices having a semiconductor substrate which is covered by an oxide layer covered, in turn, by a first layer of nitride, and wherein at least one trench is defined for growing a sidewall oxide region, comprising the steps of:

selectively etching the oxide layer within said trench pit to define peripheral recesses between the substrate and the nitride;

occluding said recesses with nitride using isotropic etchback step; and growing oxide in said trench so as to form respective sidewall sections abutting nitride portions which occlude said recesses.

36. A method according to claim 35, wherein said occluding step is performed by depositing a second surface layer of nitride which extends into the interior of the trench.

* * * * *